United States Patent
Miettinen

(10) Patent No.: US 7,679,425 B2
(45) Date of Patent: Mar. 16, 2010

(54) TURN-OFF OF GATE-CONTROLLED SWITCH

(75) Inventor: Erkki Miettinen, Helsiki (FI)

(73) Assignee: ABB Oy, Helsinki (FI)

( * ) Notice: Subject to any disclaimer, the term of this patent is extended or adjusted under 35 U.S.C. 154(b) by 0 days.

(21) Appl. No.: 11/650,986

(22) Filed: Jan. 9, 2007

(65) Prior Publication Data

US 2007/0170975 A1 Jul. 26, 2007

(30) Foreign Application Priority Data

Jan. 9, 2006 (FI) ................................ 20065011

(51) Int. Cl.
*H03K 17/687* (2006.01)
(52) U.S. Cl. ................. 327/434; 327/108; 327/377
(58) Field of Classification Search ......... 327/108, 327/377, 434
See application file for complete search history.

(56) References Cited

U.S. PATENT DOCUMENTS

| | | | | |
|---|---|---|---|---|
| 5,301,085 | A * | 4/1994 | Miettinen | 361/93.6 |
| 5,977,814 | A * | 11/1999 | Ishii | 327/434 |
| 6,326,819 | B1 | 12/2001 | Carlson | |
| 2005/0248384 | A1* | 11/2005 | Miettinen | 327/434 |

FOREIGN PATENT DOCUMENTS

| | | |
|---|---|---|
| CN | 1177408 C | 11/2004 |
| DE | 102 06 392 A1 | 9/2003 |
| EP | 0 643 485 A1 | 3/1995 |
| EP | 0 921 624 A1 | 6/1999 |
| EP | 1 037 387 A2 | 9/2000 |
| JP | 6-152353 A | 5/1994 |

OTHER PUBLICATIONS

Finnish Office Action dated Nov. 16, 2006.

* cited by examiner

*Primary Examiner*—Lincoln Donovan
*Assistant Examiner*—John W Poos
(74) *Attorney, Agent, or Firm*—Buchanan Ingersoll & Rooney PC

(57) ABSTRACT

A gate-controlled switch configuration comprising a gate-controlled switch (V4) and a gate driver system (Ctrl, D1, D2, V1, V2), which in its first functional state is configured to change the amount of charge (Qgate) in the gate (G) of the gate-controlled switch (V4) to provide a normal turn-off functionality for the gate-controlled switch (V4), and in its second functional state it is configured to maintain the amount of charge (Qgate) in the gate (G) of the gate-controlled switch (V4) substantially constant. The gate driver system (Ctrl, D1, D2, V1, V2) is configured to produce a soft turn-off functionality during which the gate driver system (Ctrl, D1, D2, V1, V2) is in the first functional state a plural number of times, and between the subsequent first functional states it is in its second functional state.

12 Claims, 1 Drawing Sheet

TURN-OFF OF GATE-CONTROLLED SWITCH

BACKGROUND OF THE INVENTION

Figure 1:
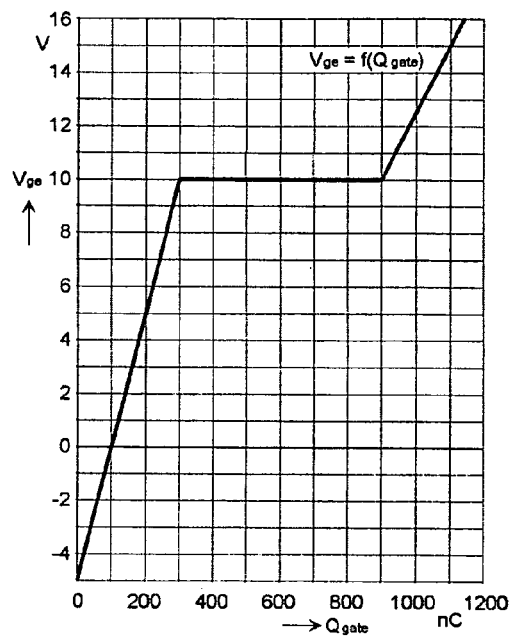

The invention relates to the turn-off of a gate-controlled switch, and particularly to the turn-off of a gate-controlled switch at a reduced rate, i.e. to what is known as a soft turn-off.

Power inversion is commonly implemented using a switch configuration in which each output phase is provided with a pair of switches connected in series between the positive and negative voltages of a direct voltage circuit, whereby an output phase branch connected to a point between the switches of each switch pair may be provided with inverted power from the direct voltage circuit.

In frequency converters and other inverters there may arise a situation where due to a malfunction the upper and lower semiconductor switches of an inverting switch pair are simultaneously conductive and therefore an extremely high current from the capacitor battery of the intermediate circuit passes through the semiconductor switches, the current being restricted by nothing but the characteristics of the semiconductor switches. This is referred to as breakthrough.

In IGB (Insulated Gate Bipolar) transistors, for example, breakthrough current may be restricted to a range that equals 5 to 10 times the nominal current, and the component sustains such current for about ten microseconds without damage. Consequently, it is necessary to succeed in switching off the current within this time. In practice the reason for breakthrough is that one of the semiconductor switches in the inverting switch pair does not obey the control and the current must be switched off with the correctly functioning switch in the branch.

However, breakthrough current must not be cut off too abruptly, because the couplings always contain stray inductance which in connection with a high rate of change in the current may generate a voltage peak which is so high that it destroys the semiconductor switches. The voltage peak û thus generated has the following formula:

$$\hat{u} = u_o - di/dt,$$

where $u_o$ represents the intermediate circuit voltage and $di/dt$ the rate of change of the current. This shows that the only way to restrict the amplitude of the voltage peak is to reduce the rate at which the current drops, i.e. to carry out what is known as a soft turn-off.

A characteristic of switches provided with an insulated gate is that the gate electrode contains capacitance against both the emitter (source) and the collector (drain) electrode. Due to these capacitances a predetermined minimum electrical charge has to be supplied to the gate to ensure that the semiconductor switch changes to a fully conductive state and, correspondingly, a charge of a similar magnitude has to be removed from the gate to open the switch. Moreover, switching-on and switching-off are phenomena that are affected by what is known as the Miller capacitance between the gate and the collector. The Miller capacitance is shown in the form of what is known as the Miller plateau in the gate voltage in situations where the gate charge is increased or decreased.

FIG. 1 shows the mutual dependency between a gate charge $Q_{gate}$ and a gate voltage $V_{ge}$ in a typical IGB-type transistor. In FIG. 1 the gate voltage $V_{ge}$ is 10V at the Miller plateau. In a turn-on situation, with the gate voltage $V_{ge}$ at the Miller plateau, collector current is substantially constant although the gate charge $Q_{gate}$ increases. Correspondingly, in a turn-off situation the gate voltage $V_{ge}$ remains on the substantially constant value of the Miller plateau for a while although the gate charge $Q_{gate}$ decreases. In other words, the decrease in the collector current in practice stops for the time the gate voltage $V_{ge}$ is at the Miller plateau.

A simple way to carry out a soft turn-off is to allow the gate charge $Q_{gate}$ of the semiconductor switch to be discharged through a suitable turn-off resistor either to the emitter potential or to a negative turn-off potential. This is a non-linear process, because the crossing of the Miller plateau takes fairly long, and during that time breakthrough current hardly changes at all. The resistance of the turn-off resistor employed is typically a few hundred ohms.

The turn-off method described above usually requires that a separate soft turn-off controller and a soft turn-off signal are used to connect the turn-off resistor to the circuit for a suitable length of time, such as 100 µs, before a normal turn-off, known as a hard turn-off, is carried out. Alternatively, the turn-off resistor may be allowed to be permanently connected to the circuit, in which case it consumes a lot of energy from the gate driver circuit whenever the gate voltage of the semiconductor switch is positive, which in turn requires a higher power supply capacity in the gate driver than in a configuration without a turn-off resistor. Both a separate soft turn-off controller and a gate driver of a higher capacity cause extra costs.

It is also known in the art to reduce the gate voltage by a separate control circuit in a controlled manner in such a way that the Miller plateau is crossed fast and the breakthrough current decreases almost at a constant rate. However, this requires the use of an expensive analog circuit and a signal to either control a soft turn-off or to convey a completed soft turn-off to the control logic in another potential. Configurations of this type are typically even much more expensive than a soft turn-off involving a turn-off resistor.

BRIEF DESCRIPTION OF THE INVENTION

It is an object of the invention to provide a simple configuration and a method for carrying out a soft turn-off of a gate-controlled switch. The object of the invention is achieved by a configuration and method characterized by what is stated in the independent claims. The preferred embodiments of the invention are disclosed in the dependent claims.

The invention is based on the idea of providing a gate-controlled switch with a soft turn-off that comprises a plural number periods in which gate charge is changed similarly as in a normal hard turn-off, and a plural number of intermediate periods each one of which takes place between two gate charge change periods, the amount of gate charge being kept substantially constant during each intermediate period.

An advantage of the invention is that it allows soft turn-off to be carried out by software and by applying components provided for normal turn-off operations.

The configuration of the invention provided with a soft turn-off functionality is simpler and more affordable than corresponding prior art configurations.

LIST OF FIGURES

Figure 2:
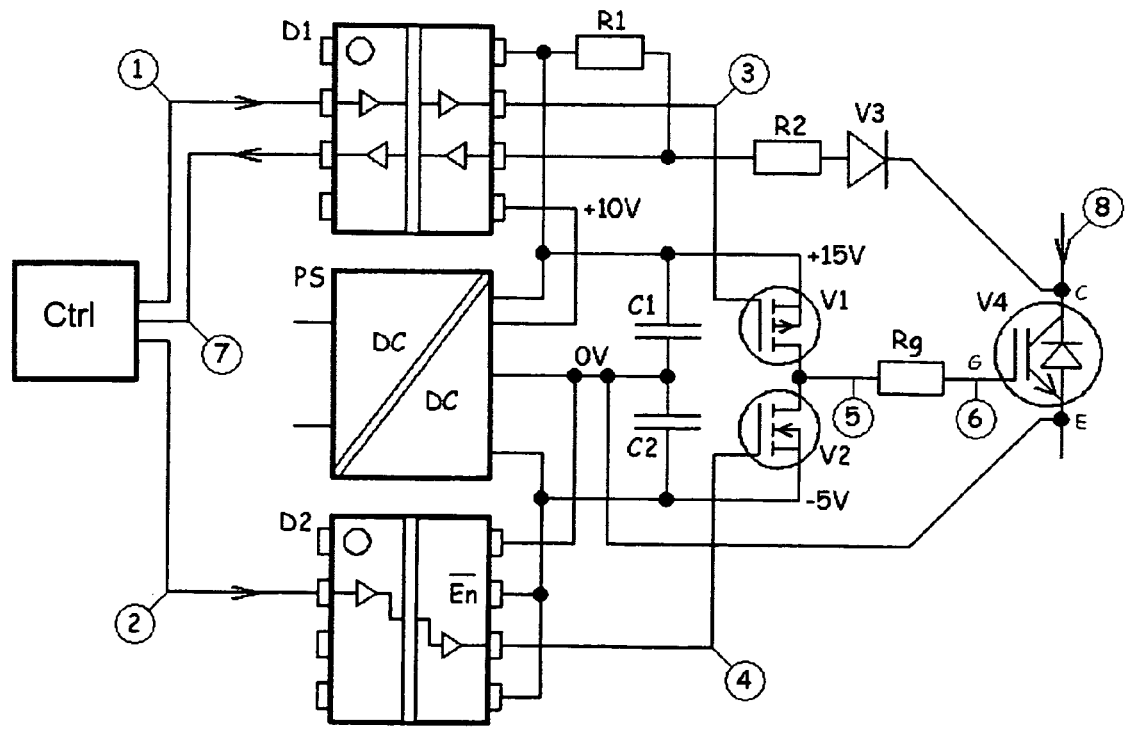

FIG. 1 shows the mutual dependency between a gate charge and a gate voltage in a typical IGB transistor; and FIG. 2 shows a configuration according to an embodiment of the invention that comprises a gate-controlled switch.

DETAILED DESCRIPTION OF THE INVENTION

FIG. 2 shows a configuration according to an embodiment of the invention, the configuration comprising a gate-controlled switch V4 and a gate driver system connected to the gate thereof, the system containing a first output stage switch V1 and a second output stage switch V2. The gate-controlled switch V4 may be turned on and off by selectively controlling the output stage switches V1 and V2 to a conductive and a non-conductive state. The output stage switches V1 and V2 of FIG. 2 are output stage field-effect transistors (FETs).

Further, the gate control system comprises an auxiliary voltage source PS providing galvanic decoupling, separators D1 and D2, and a control logic Ctrl. The auxiliary voltage source PS produces voltages of +15, +10 and −5 volts to be used both by the separators D1 and D2 and the output stage FETs V1 and V2. If both signals 1 and 2 (3 and 4) coming from the control logic are in state 0, the output stage FET V1 assumes a conducting state and V2 a non-conducting state. This means that a turn-on signal of +15 volts is supplied to the gate G of the switch V4. Correspondingly, if both signal 1 and signal 2 are in state 1, the output state FET V1 assumes the non-conducting state and V2 the conducting state. This means that a turn-off signal of −5 volts is supplied to the gate G of the switch V4. In both cases the instantaneous current of the gate is restricted by a gate resistor Rg.

Although in the circuit diagram of FIG. 2 the separators D1 and D2 are digital separators, a configuration of the invention comprising a gate-controlled switch may be implemented using separators of some other type as well.

In the configuration of FIG. 2 the supply of the turn-on signal to the gate of switch V4 increases the gate charge $Q_{gate}$ of the switch V4 and the supply of the turn-off signal to the gate of the switch V4 in turn decreases the gate charge $Q_{gate}$ of the switch V4. It is obvious that by modifying the configuration of FIG. 2 it would be possible to produce, for example, an embodiment in which the turn-on of a gate-controlled switch requires that the gate charge $Q_{gate}$ is decreased and the turn-off of the gate-controlled switch in turn requires that the gate charge $Q_{gate}$ is increased. An essential aspect here is that the amount of the gate charge $Q_{gate}$ of a switch in which gate control is carried out by means of a turn-on signal is changed to a direction corresponding to the closed-position of the gate-controlled switch, i.e. the position in which it is switched on. Correspondingly, the amount of the gate charge $Q_{gate}$ of a switch in which gate control is carried out by means of a turn-off signal is changed to a direction corresponding to the open-position of the gate-controlled switch, i.e. the position in which it is switched off.

If signal 1 is in state 1 and signal 2 in state 0, both V1 and V2 are non-conductive. This means that the gate charge $Q_{gate}$ of the switch V4 neither increases nor decreases. A situation in which signal 1 is in state 0 and signal 2 in state 1 is barred, because it would lead to a breakthrough of the output stage FETs V1 and V2. This barring is typically provided by the control logic Ctrl.

If current 8 passing through the collector C is too high, due to breakthrough, for example, information about this current is supplied in a prior art manner through components V3 and R2 and the upper digital separator D1 to the control logic Ctrl. The control logic Ctrl then starts to reduce gradually the gate charge $Q_{gate}$ of the switch V4 in such a way that the collector current 8 decreases at a desired rate to a sufficiently low level the hard turn-off to be started. This is carried out by changing the state of the switch V4 in an optimal manner between two different functional states, the first one of which corresponds to the hard turn-off of the switch V4, with signals 1 and 2 both in state 1, and in the second functional state the gate of the switch V4 is detached from the gate driver, signal 1 being in state 1 and signal 2 in state 0.

The optimal manner of controlling the gate-controlled switch V4 between the first and the second functional states depends on the type and characteristics of the switch V4. In the embodiment of FIG. 2 the gate-controlled switch V4 is an IGB transistor in which the dependency between the gate charge $Q_{gate}$ and the gate voltage $V_{ge}$ is as shown by the curve of FIG. 1. Alternatively, the switch V4 may be an IGB transistor provided with some other characteristics, another type of semiconductor switch with an insulated gate, or another type of gate-controlled switch with switching properties suitable for the purpose.

Each hard turn-off pulse removes from the gate G of the switch V4 a charge whose magnitude depends on the turn-off voltage, the resistance of the gate resistor Rg and the length of the turn-off pulse. Correspondingly, the gate charge $Q_{gate}$ does not change during the time the gate G is detached from the gate driver.

FIG. 1 shows that the gate charge $Q_{gate}$ of the gate-controlled switch V4 is 1100 nC at a nominal gate voltage of +15 volts. If the gate resistor Rg is 10 ohms, the magnitude of the gate current generated by a first hard turn-off pulse is (+15V−(−5V))/10 ohm =2 A. If the length of the hard turn-off pulse is 31 ns (on a clock of 32 MHz), i.e. it is suitable for the gate driver system shown in FIG. 2, the charge removed from the gate G is approximately 31 ns*2 A=62 nC.

The curve in FIG. 1 shows that a decrease of 62 nC on the first turn-off pulse causes the gate voltage to drop from the nominal +15 volts to about +13 volts, which is not yet at the Miller plateau and therefore the collector current 8 is still dangerously high. After a second hard turn-off pulse of 31 ns the magnitude of the generated gate current is only (+13V−(−5V))/10 ohm=1.8 A, i.e. the magnitude of the gate charge conveyed is approximately 31 ns*1.8 A=55 nC. Even with this pulse the Miller plateau is not reached yet, but by repeating the described pulses at suitable intervals it is possible to bring the gate charge $Q_{gate}$ to such a low level that the flow of the collector current 8 finally stops completely.

With the above parameters each hard turn-off pulse reduces the gate charge $Q_{gate}$ of switch V4 by about five percent, which means that it takes about twenty pulses to remove the charge entirely. A breakthrough situation is usually confirmed to be real and continuous in a few microseconds, the time left for a safe soft turn-off being typically about five microseconds. Thus the cycle period of hard turn-off pulses, obtained by equal division, is 5 µs/20=250 ns.

Instead of an even pulse division it is possible to adopt a strategy, in which an attempt is made to reduce the collector current 8 at a rate as steady as possible, which means that during the soft turn-off functionality the ratio of the durations of the first functional states to the durations of the second functional states is changed by altering the duration of individual first functional states and/or by changing their number per time unit.

The rate at which the collector current of a gate-controlled switch decreases may be levelled by implementing the configuration such that during the soft turn-off functionality, with the gate voltage $V_{ge}$ at the Miller plateau, the durations of the first functional states are longer and/or there are more of them per time unit than when the gate voltage $V_{ge}$ is outside the Miller plateau.

The configuration of the invention may also be configured such that during the soft turn-off functionality, with the gate voltage $V_{ge}$ above and/or below the Miller plateau, the ratio of the durations of the first functional states to those of the second functional states is increased as a function of time by extending the duration of individual first functional states and/or by increasing their number per time unit.

The optimal manner of controlling a specific gate-controlled switch during the soft turn-off functionality can be established by test measurements. The optimal control method of the switch may then be stored for example in a circuit contained in the control logic and comprising an FPGA (Field Programmable Gate Array).

In the configuration of FIG. 2 the soft turn-off of the gate-controlled switch V4 is achieved by software, using control signals 1 and 2 of the control logic Ctrl. Hence, the circuit diagram of FIG. 2 does not contain any new components as compared with a configuration comprising a prior art gate-controlled switch with no soft turn-off functionality. Consequently, the soft turn-off functionality does not increase component costs, nor does any circuit board space need to be reserved for it. In addition, the soft turn-off functionality of the invention is easily programmable to suit different semiconductor types.

A person skilled in the art will find it obvious that the basic idea of the invention can be implemented in various ways. The invention and its embodiments are therefore not restricted to the above examples but may also be varied within the scope of the claims.

The invention claimed is:

1. A gate controlled switch configuration comprising: a gate-controlled switch and a gate driver system connected to a gate of the gate controlled switch, the gate driver system including a controller adapted to output control signals, the gate driver system has a first functional state and a second functional state, in its first functional state the gate driver system is configured to change the amount of charge in the gate of the gate-controlled switch to provide a normal turn-off functionality for the gate-controlled switch and in its second functional state the gate driver system is configured to maintain the amount of charge in the gate of the gate-controlled switch substantially constant, the gate driver system adopts its first or second functional state based on control signals of the controller, wherein the controller is configured to produce a soft turn-off functionality during which the gate driver system adopts the first functional state a plural number of times, and between the subsequent first functional states the gate driver system is in its second functional state, wherein the controller is configured to change the ratio of the durations of the first functional states to the durations of the second functional states during the soft turn-off functionality by altering the duration of individual first functional states and/or by changing their number per time unit.

2. The configuration according to claim 1, wherein during the soft turn-off functionality the ratio of the durations of the first functional states to the durations of the second functional states is greater when the gate voltage is at the Miller plateau than when the gate voltage is outside the Miller plateau.

3. The configuration according to claim 2, wherein during the soft turn-off functionality, when the gate voltage is above the Miller plateau and/or when the gate voltage is below the Miller plateau, the controller is configured to increase the ratio of the durations of the first functional states to the durations of the second functional states as a function of time by extending the duration of individual first functional states and/or by increasing their number per time unit.

4. The configuration according to claim 2, wherein the gate driver system comprises a first output stage switch and a second output stage switch and each of the output stage switches may be selectively controlled to a conductive state and a non-conductive state by the controller, the first output stage switch and the second output stage switch being connected to the gate of the gate controlled switch such that the first functional state of the gate driver system is achieved by a first combination of the states of the output stage switches and the second functional state of the gate driver system is achieved by a second combination of the states of the output stage switches.

5. The configuration according to claim 1, wherein during the soft turn-off functionality, when the gate voltage is above the Miller plateau and/or when the gate voltage is below the Miller plateau, the controller is configured to increase the ratio of the durations of the first functional states to the durations of the second functional states as a function of time by extending the duration of individual first functional states and/or by increasing their number per time unit.

6. The configuration according to claim 5, wherein the gate driver system comprises a first output stage switch and a second output stage switch and each of the output stage switches may be selectively controlled to a conductive state and a non-conductive state by the controller, the first output stage switch and the second output stage switch being connected to the gate of the gate controlled switch such that the first functional state of the gate driver system is achieved by a first combination of the states of the output stage switches and the second functional state of the gate driver system is achieved by a second combination of the states of the output stage switches.

7. The configuration according to claim 1, wherein the gate driver system comprises a first output stage switch and a second output stage switch and each of the output stage switches may be selectively controlled to a conductive state and a non-conductive state by the controller, the first output stage switch and the second output stage switch being connected to the gate of the gate controlled switch such that the first functional state of the gate driver system is achieved by a first combination of the states of the output stage switches and the second functional state of the gate driver system is achieved by a second combination of the states of the output stage switches.

8. The configuration according to claim 7, wherein the gate driver system further comprises a first separator configured to selectively control the first output stage switch to a conductive state and a non-conductive state, a second separator configured to selectively control the second output stage switch to a conductive state and a non-conductive state, the controller being adapted control the separators by the control signals.

9. The configuration according to claim 1, wherein the gate driver system comprises a first output stage switch and a second output stage switch and each of the output stage switches may be selectively controlled to a conductive state and a non-conductive state by the controller, the first output stage switch and the second output stage switch being connected to the gate of the gate controlled switch such that the first functional state of the gate driver system is achieved by a first combination of the states of the output stage switches and the second functional state of the gate driver system is achieved by a second combination of the states of the output stage switches.

10. A method for providing a soft turn-off functionality of a gate-controlled switch, wherein the method comprises the steps of:

(a) changing the charge of the gate of the gate-controlled switch during a predetermined time period in the same way as in a normal turn-off of the gate-controlled switch;
(b) maintaining the charge of the gate substantially constant during a predetermined time period; and
(c) repeating steps (a) and (b) for a plural number of times until predetermined conditions are met.

11. The method according to claim 10, wherein the predetermined conditions are met when it is safe to start using normal, continuous turn-off of the gate-controlled switch.

12. A gate-controlled switch configuration comprising: a gate-controlled switch, a gate driver system connected to a gate of the gate controlled switch, and a controller adapted to control the gate driver system by control signals, the gate driver system has a first functional state and a second functional state, in its first functional state the gate driver system is adapted to change the amount of charge in the gate of the gate-controlled switch in order to provide a normal turn-off functionality for the gate controlled switch, and in its second functional state the gate driver system is adapted to maintain the amount of charge in the gate of the gate-controlled witch substantially constant, the gate driver system adopts it first or second functional state based on control signals of the controller, wherein the controller has a soft turn-off state in which the controller controls the gate driver system to the first functional state in a plural number of times, and between the subsequent first functional states the controller controls the gate drive system to the second functional state,
wherein the gate driver system comprises a first output stage switch and a second output stage switch, both the first output stage switch and the second output stage switch having a conducting state and a non-conducting state, the controller being adapted to change the state of both the first output stage switch and the second output stage switch between the conducting state and the non-conducting state by the control signals, wherein the first functional state of the gate driver system is achieved with a first state combination of the first output stage switch and the second output stage switch, and the second functional state of the gate driver system is achieved with a second state combination of the first output stage switch and the second output stage switch, and
wherein the first state combination the first output stage switch is in the non-conducting state and the second output stage switch is in the conducting state, and in the second state combination both the first output stage switch and the second output stage switch are in the non-conducting state.

* * * * *